US010447214B2

(12) United States Patent
Andrei et al.

(10) Patent No.: US 10,447,214 B2
(45) Date of Patent: Oct. 15, 2019

(54) AMPLIFIER CIRCUIT AND METHOD

(71) Applicant: Rohde & Schwarz GmbH & Co. KG, München (DE)

(72) Inventors: Andreas Andrei, Petershagen (DE); Klaus Sauerbier, Strausberg (DE); Marco Witte, Berlin (DE); Orell Garten, Ohom (DE); Raimon Goeritz, Berlin (DE); Uwe Dalisda, Fürstenfeldbruck (DE); Florian Ohnimus, Berlin (DE); Reimo Dueben, Schöneiche (DE)

(73) Assignee: ROHDE & SCHWARZ GMBH & CO. KG, München (DE)

( * ) Notice: Subject to any disclaimer, the term of this patent is extended or adjusted under 35 U.S.C. 154(b) by 0 days.

(21) Appl. No.: 15/860,942

(22) Filed: Jan. 3, 2018

(65) Prior Publication Data

US 2019/0052237 A1    Feb. 14, 2019

(30) Foreign Application Priority Data

Aug. 8, 2017 (EP) ..................... 17185334

(51) Int. Cl.
*H03F 3/68* (2006.01)
*H03F 3/195* (2006.01)
(Continued)

(52) U.S. Cl.
CPC ............... *H03F 3/195* (2013.01); *H03F 1/32* (2013.01); *H03F 3/189* (2013.01); *H03F 3/24* (2013.01); *H03F 3/45475* (2013.01); *H03F 3/602* (2013.01); *H03F 3/68* (2013.01)

(58) Field of Classification Search
CPC ........ H03F 3/195; H03F 3/24; H03F 3/45475; H03F 1/0288; H03F 1/07; H03F 3/60;
(Continued)

(56) References Cited

U.S. PATENT DOCUMENTS 3,846,719 A     11/1974  Dolby
5,015,965 A *    5/1991  Katz .................... H03F 1/3241
                                                          330/149

(Continued)

FOREIGN PATENT DOCUMENTS

JP        S5792906 A      6/1982
WO       9956339 A1     11/1999
WO     2005041405 A1      5/2005

OTHER PUBLICATIONS

Extended European search report for European Patent Application No. 17185334.4, dated May 4, 2018, 16 pages.
Search Report from European Patent Application No. 17185334.4, dated Feb. 13, 2018, 15 pages.

*Primary Examiner* — Khanh V Nguyen
(74) *Attorney, Agent, or Firm* — Westman, Champlin & Koehler, P.A.

(57) ABSTRACT

The present invention provides an amplifier circuit for amplifying an incoming signal, the amplifier circuit comprising at least two signal paths configured to amplify signals of different overlapping frequency bands, a signal splitter comprising an input port configured to receive the incoming signal, the signal splitter being coupled to an input side of the signal paths and configured to split the incoming signal into split signals for the signal paths, and a diplexer coupled to an output side of the signal paths and configured to combine the amplified signals and provide a combined amplified signal. Further, the present invention provides a respective method.

17 Claims, 5 Drawing Sheets

(51) Int. Cl.
*H03F 1/32* (2006.01)
*H03F 3/189* (2006.01)
*H03F 3/60* (2006.01)
*H03F 3/24* (2006.01)
*H03F 3/45* (2006.01)

(58) Field of Classification Search
CPC .......... H03F 3/602; H03F 3/605; H03F 3/607; H03F 3/54; H03F 3/211; H03F 1/20; H03F 3/604; H04B 3/06
USPC .......................... 330/53, 54, 124 R, 286, 295
See application file for complete search history.

(56) References Cited

U.S. PATENT DOCUMENTS

| | | | |
|---|---|---|---|
| 5,805,716 A | | 9/1998 | Maag et al. |
| 6,107,898 A | * | 8/2000 | Rauscher ................ H03F 3/602 333/166 |
| 6,252,461 B1 | * | 6/2001 | Raab .................... H03F 1/0205 330/124 R |
| 6,552,634 B1 | * | 4/2003 | Raab .................... H03F 1/0205 330/124 R |
| 7,298,206 B2 | | 11/2007 | Pickerd et al. |
| 8,401,058 B1 | * | 3/2013 | Lam .................... H04B 1/0483 330/150 |
| 8,477,832 B2 | * | 7/2013 | Sawatzky ............ H03G 3/3042 330/124 R |
| 9,461,590 B2 | * | 10/2016 | Langer ................ H03F 1/0205 |
| 2006/0139091 A1 | * | 6/2006 | Fratti .................... H03F 1/0288 330/124 R |
| 2016/0094187 A1 | * | 3/2016 | Staudinger ............ H03F 1/0288 330/295 |

\* cited by examiner

AMPLIFIER CIRCUIT AND METHOD

CROSS-REFERENCE TO RELATED APPLICATION(S)

This application claims priority to European Patent Application No. 17185334.4, filed on Aug. 8, 2017, the contents of which are hereby incorporated in its entirety.

TECHNICAL FIELD

The present invention relates to an amplifier circuit. The present invention further relates to a respective method.

BACKGROUND

Although applicable in principal to any system that requires broadband signal amplification, the present invention and its underlying problem will be hereinafter described in combination with broadband amplifiers with instantaneous bandwidth regarding the incoming signal.

In modern electronics applications frequencies of data transmission signals continuously rise with increased bandwidth requirements. Further additional applications, like e.g. wireless sensor networks or the like emerge, that use frequency bands, e.g. in the range of 2-8 GHz.

Especially during development and conformance testing of devices for such modern applications, it is therefore necessary to be able to cope with and e.g. measure or generate high bandwidth signals e.g. from some MHz to some GHz, like e.g. from 10 MHz to 10 GHz.

Common amplifier arrangements for such applications usually comprise a plurality of high bandwidth or broadband amplifiers with the same frequency range. Combiners, like e.g. a Wilkinson coupler, a $n*\lambda/4$ coupled, or a Branchline coupler, a Guanella coupler or a Marchand coupler are usually used to combine the signals of the single broadband amplifiers.

However, these couplers are bandwidth limited and require that the individual broadband amplifiers all cover the entire frequency band of interest. Further, all broadband amplifiers must run with equal phase and amplitude frequency response.

Such arrangements are therefore complex and expensive.

SUMMARY

Against this background, there is the need to provide a simplified amplifier arrangement with a large instantaneous bandwidth.

According to a first aspect, an amplifier circuit for amplifying an incoming signal is provided, the amplifier circuit comprising at least two signal paths configured to amplify signals of different overlapping frequency bands, a signal splitter comprising an input port configured to receive the incoming signal, the signal splitter being coupled to an input side of the signal paths and configured to split the incoming signal into split signals for the signal paths, and a diplexer coupled to an output side of the signal paths and configured to combine the amplified signals and provide a combined amplified signal.

According to a second aspect, a method for amplifying an incoming signal is provided, the method comprising receiving the incoming signal, splitting the incoming signal into split signals for at least two signal paths, amplifying the split signals in the signal paths with different overlapping frequency bands, and diplexing the amplified signals and providing a combined amplified signal.

The present invention is based on the finding that broadband amplifiers with a very large instantaneous bandwidth are difficult and complex to manufacture.

The present invention therefore provides an amplifier circuit that does not use identical amplifiers or amplifiers that cover the same very large bandwidth. With such amplifiers, and all other amplifiers, there is always a trade-off between bandwidth and amplifying power. Providing a high bandwidth amplifier with high amplifying power is therefore very complex.

Therefore, the present invention uses amplifiers that work in different frequency ranges with high power and after amplification of the single signal parts diplexes the signals. This also means that amplifiers with smaller frequency bands or ranges may be used as compared to a single broadband amplifier. This simplifies providing high power amplification.

The present invention therefore provides different signal paths with different amplification characteristics. The signal splitter receives the incoming signal via the input port and splits the incoming signal into split signals for the single signal paths.

The single signal paths may then amplify the respective split signals in different but overlapping frequency bands. If more than two signal paths are provided, "overlapping" refers to the frequency band of the first signal path overlapping on one end with the frequency band of the second signal path and the frequency band of the third signal path overlapping on the other end with the frequency band of the second signal path. The frequency band of the second signal path therefore lays between the frequency bands of the first and the third signal path. If only two signal paths are provided, the frequency bands may overlap in the center. The overlap between the frequency bands may e.g. be a predetermined overlap of about 50 MHz to 1 GHz, e.g. 100 MHz, 200 MHz, 300 MHz, or 400 MHz.

The outputs of the single signal paths, i.e. the amplified split signals, are then provided to the diplexer. The diplexer will combine the single amplified split signals into a single output signal, i.e. the combined amplified signal.

The diplexer may e.g. be a passive device that performs a kind of frequency multiplexing. The diplexer multiplexes the input ports onto an output port, i.e. the amplified split signals onto the combined amplified signal. In contrast to combiners, the signals on the input ports of common diplexer occupy disjoint frequency bands. The diplexer of the present invention however is arranged to multiplex the amplified split signals, e.g. signals with different but overlapping frequency bands. This means that the diplexer works like a combiner only in the overlapping frequency region. The amplified split signals therefore coexist on the output port without interfering with each other but for the overlap frequency region.

Exemplary frequency bands for two signal paths and a corresponding diplexer may e.g. comprise a low frequency band, e.g. 20 MHz-1.6 GHz, and a high frequency band, e.g. 1.2 GHz-8 GHz. It can be seen, that the frequency bands in this example overlap in a range of 400 MHz between 1.2 GHz and 1.6 GHz. This means that the diplexer will work like a combiner in the frequency range between 1.2 GHz and 1.6 GHz and output the diplexed and the combined amplified split signals.

It is understood, that the diplexer may comprise two or more input ports. Diplexers with more than two input ports may also be called triplexers, quadplexer or quadruplexer and so on.

With the present invention it is possible to provide a broadband amplifier circuit that comprises a plurality of single amplifiers for specific frequency bands. The individual amplifiers need not cover the entire frequency range of the broadband amplifier circuit and may be optimized individually, e.g. regarding the gain/power and the gain/bandwidth product. Further multiple amplifiers with a limited bandwidth are less complex and simple to manufacture compared to single broadband amplifiers for the full frequency range.

The frequency and power performance of the amplifier circuit is therefore only limited by the component selection and design of the diplexer.

Further embodiments of the present invention are subject of the further subclaims and of the following description, referring to the drawings.

In a possible embodiment, every signal path may comprise an amplifier for amplifying the respective split signal in the frequency band of the respective signal path.

The amplifiers may e.g. be high power amplifiers, in the power range of 10 W to 1000 W, like e.g. 50 W amplifiers, 100 W amplifiers, 200 W amplifiers or the like. As already explained above, it is difficult to provide high power amplifiers that at the same time comprise a large bandwidth.

With the present invention however, amplifiers with a relatively small bandwidth may be used that at the same time provide a high power output. The amplifiers in the signal paths each only need to be adapted to amplify signals in the respective frequency band and may therefore focus on the output power.

Further, the behavior of the amplifiers in the signal ranges above and below the respective frequency bands is irrelevant, since this signals will be removed by the diplexer.

The single amplifiers may in an embodiment be linear amplifiers.

In a possible embodiment, the diplexer may comprise a first frequency selective element for every signal path, wherein the first frequency selective elements may be configured to pass through signals of the frequency band of the respective signal path to a summing point of the diplexer.

The first frequency selective elements may e.g. comprise high-pass filters, low-pass filters and band-pass filters. As explained above, the single signal paths operate on, i.e. amplify, signals in different frequency bands or ranges.

The first frequency selective elements are adapted to the respective frequency ranges. This means that a first frequency selective element will have a transmission band that at least comprises the frequency band of the respective signal path.

If for example a signal path amplifies signals in the frequency band from 20 MH to 1.6 GHz, the respective first frequency selective element will comprise a transmission band of at least 20 MHz to 1.6 GHz.

The first frequency selective elements for the above mentioned example of two signal paths with frequency bands of 20 MHz to 1.6 GHz and 1.2 GHz to 8 GHz therefore would comprise transmission bands of at least 20 MHz to 1.6 GHz and of 1.2 GHz to 8 GHz. With only two signal paths, the lower frequency range of the 20 MHz to 1.6 GHz transmission band may be lower than 20 MHz. The same applies to the upper frequency range of the 1.2 GHz to 8 GHz transmission band. The upper frequency may e.g. be higher than 8 GHz. Signal components with frequencies outside of the respective frequency bands will in any case not be provided by the signal paths to the diplexer.

The exact dimensions of the single elements of the first frequency selective elements may e.g. be calculated after deciding on a circuit topology or may be determined by simulation of the respective topology.

In a possible embodiment, the diplexer may comprise a non-isolating diplexer, and the first frequency selective elements may comprise overlapping frequency ranges with the corner frequencies of the first frequency selective elements laying in the transmission band of the first frequency selective element for the respective neighboring frequency band.

Isolating diplexers may e.g. comprise a resistive element between the single signal inputs that acquires or consumes energy at least in a specific frequency range. This means that the energy at least in the specific frequency range does not travel from one input to the other input or is at least attenuated.

In the non-isolating diplexer the single first frequency selective elements comprise no resistive elements. Such first frequency selective elements may e.g. solely comprise capacitors and inductors. In such a non-isolating diplexer signals in the overlapping frequency range or band of the first frequency selective elements may travel from one input via the summing point, i.e. the output, to another input of the diplexer. This ensures the combiner-like behavior of the diplexer in the overlap frequency band and allows signals in the overlap frequency band from both respective signal paths to travel to the summing point.

It is understood, that depending on the respective frequency range and the required maximum amplification power, different technologies may be used to manufacture the non-isolating diplexer. The circuit elements of the first frequency selective elements may e.g. be provided as discrete elements, also called lumped elements, or as distributed elements, e.g. capacitors or inductors formed by traces of conductive areas on a PCB.

In a possible embodiment, the amplifier circuit may comprise an amplitude adjusting element for a number, i.e. one or more, of the signal paths, wherein one signal paths may optionally not comprise an amplitude adjusting element. The amplitude adjusting elements may be configured to adjust the amplitude of the split signal for the respective signal path by a predetermined factor.

The signal path that does not comprise an amplitude adjusting element may be seen as a kind of reference signal path that defines a base amplitude. Base amplitude refers to the amplitude of the signals at the summing point or output of the diplexer in the overlap frequency band(s).

The signal path that does not comprise an amplitude adjusting element may e.g. be the signal path for the lowest frequency band. In the overlapping frequency band, the amplified split signals of this signal path and the signal path for the next higher frequency band will mix. If the amplitudes of the signals are not identical, the signal path with the lower signal amplitude will suffer load modulation by the signal part of the signal path with the higher amplitude. To avoid such load modulation, the amplitudes of both signal paths may be levelled by adjusting the incoming split signal prior to amplification, e.g. by the amplifier of the respective signal path.

It is understood, that different amplifiers may comprise different amplification properties. An amplifier in the reference signal path may e.g. provide 100 W output power with 10 mW input power. An amplifier of the next signal path may e.g. provide 100 W output power with 20 mW input power (next referring to the signal path for the next frequency band). In this case the factor for the amplitude adjusting element of the next signal path may e.g. be 2. This means that the amplitude adjusting element will multiply the signal levels of the respective split signal by 2. Such an amplitude adjusting element may e.g. be an amplifier with a low amplification of 2.

If the other signal path however requires lower signal levels to provide the same output power as the reference signal path, an attenuation of the respective split signal may be performed. If for example the amplifier of the reference signal path provides 100 W output power with 20 mW input power and the amplifier of the next signal path provides 100 W output power with 10 mW input power, the amplitude adjusting element may attenuate the incoming split signal to ½ for the next signal path. Such an amplitude adjusting element may e.g. comprise a voltage divider.

If more than two signal paths are provided it is understood, that the reference signal path continues to be the reference for the second or next signal path. The second signal path will then be the reference signal path for the third signal path and so on.

In a possible embodiment, at least one of the amplitude adjusting elements may comprise an attenuation resistor or an amplifier.

Depending on whether the split signal for the respective signal path must be amplified or attenuated, the amplitude adjusting elements may comprise resistors or amplifiers. The attenuation resistor may be used in any case in which the split signal level in the other signal paths must be lowered with regard to the signal level of the split signal in the reference signal path.

It is understood, that the amplifiers will usually not require a high amplification factor. In the above example the amplification factor is two. It is understood, that other amplification factors, e.g. between 1 and 10 are possible. Amplifiers with low amplification factors of up to 10 for low level signals, like the split signals, are very simple elements that may easily be integrated into the amplifier circuit. Further, as explained above, there is a trade-off between amplification and bandwidth. Therefore, with low amplification factors high bandwidths may be amplified.

It is understood, that the amplitude adjusting element may be configurable or at least adjustable. The amplitude adjusting element may e.g. be adjusted or configured during production of the amplifier circuit, e.g. during an end of line test or a calibration step. In case that resistors are used, an adjustable resistor like a potentiometer may be used. As alternative, a resistive track, e.g. of a resistive paste or copper traces may be adjusted by adjusting the size of the track, e.g. by laser cutting.

In case of amplifiers in the amplitude adjusting element, the amplifiers may e.g. be voltage controlled and the control voltage of the amplifier may be adjusted in the respective production step.

It is understood, that the configuration of the amplitude adjusting element may be determined only once and then be fixed for the life of the amplifier circuit. It is however also understood, that a control may be implemented for the amplitude adjusting element that accounts for wear and aging effects in the signal paths and the diplexer.

In a possible embodiment, the signal splitter may comprise a resistive splitter with a first resistor for every signal path coupled between the signal input and the respective signal path, and the signal splitter may especially comprise a second resistor coupled between the input port and the first resistors.

Resistive signal splitters are very simple types of splitters. In the case of an amplifier circuit with two signal paths, the splitter may be provided with only two or three resistors. The second resistor may e.g. be provided between the input port and a splitting point. The first resistors may then be coupled between the splitting point and the respective signal path.

Resistive signal splitters are not only very simply to manufacture. Such resistive signal splitters further comprise a very large transmission band or range. In theory the transmission band or range is unlimited. However, in practical applications, the transmission band or range will be limited by parasitic capacities and inductances. It is understood, that this kind of splitter may also be provided with lumped or distributed elements or a combination of both.

The resistive splitter may provide equal split signals to the single signal paths. Such a resistive splitter may be seen as a kind of voltage divider with two equal voltages on the outputs.

In a possible embodiment, the attenuation resistor of at least one of the amplitude adjusting elements may comprise the first resistor of the signal splitter for the respective signal path.

As explained above, the signal splitter may provide equal signals to the single signal paths. However, if the reference signal path is the signal path with the lowest signal level at the summing point of the diplexer, the signal levels of the other signal paths only need to be attenuated. This may preferably be performed by resistors, which are very simple electric elements.

It is further possible to combine the resistor of the amplitude adjusting element with the first resistor of the signal splitter for the respective signal path. The output signal level of the signal splitter for the respective signal path may e.g. be tuned as required.

In the example provided above, the signal level at an output of the signal splitter for e.g. the second signal path may be half the signal level of the output for the reference signal path. The output levels of the signal splitter therefore comprise a relation of 2:1. It is understood, that these values are just exemplary values and that any other values may be provided as required in the respective application.

In a possible embodiment, the signal splitter may comprise a second frequency selective element for every signal path, and the second frequency selective elements may be configured to pass through signals of the frequency band of the respective signal path to the respective signal path.

Instead of a resistive splitter a frequency selective splitter may be provided that provides to the single signal paths only the signal parts in the frequency band of the respective signal path.

It is understood, that the second frequency selective elements may be the same as the first frequency selective elements for the respective signal paths. The second frequency selective elements may e.g. be the first frequency selective elements in a reverse arrangement, i.e. the output is the input and vice versa. It is however also understood, that the first frequency selective elements may also be dimensioned for smaller power values. As already explained above, the power level on the input side, i.e. the input port, may be in the range of milliwat, while the power level on the output side may be in the range of hundreds of watts. The topology of the second frequency selective elements and the values of the single electric elements, e.g. capacitors and inductances, may however be the same as for the respective first frequency selective elements.

In a possible embodiment, the amplifier circuit may comprise a phase shifter for a number, i.e. one or more, of the signal paths, wherein one of the signal paths may optionally not comprises a phase shifter. The phase shifters may be configured to adjust the phase of the split signal for the respective signal path by a predetermined factor.

The signal path that does not comprise a phase shifter may be the same as the signal path that does not comprise an amplitude adjusting element. This signal path therefore also serves as the reference signal path for the phase of the signals at the summing point.

If the signal of two signal paths that comprise overlapping frequency bands or ranges are out of phase the signal levels may not sum as required. Depending on the phase shift, the signals may e.g. partly cancel out each other or even cancel out each other completely. This is the case with a 180° phase shift. Further, as with different amplitudes, with a phase shift the signal path with the momentarily lower signal level may suffer load modulation.

Therefore, the amplifier circuit comprises the phase shifter that adjusts the phases of the signal paths where necessary. Again the reference signal path provides the reference, in this case the reference phase. The phase shifter as the amplitude adjusting element may be provided before the amplifier of the respective signal path. This means that the phase shifter need not be adapted for high power signals.

Any element in the single signal paths may introduce a certain phase shift to the respective split signal. This means that at the summing point even an amplitude adjusted amplified split signal may comprise a momentary amplitude that is different from the reference amplitude in the overlap frequency band.

With the phase shifter, this difference in amplitude may be compensated such that the signals in the overlap frequency band at the summing point comprise the same phase.

The phase shifter may e.g. be a configurable delay line. If the signal is delayed it will arrive later at the amplifier of the respective signal path. This will cause a phase shift with reference to the reference signal path. The length of the delay line may e.g. be modified by providing respective signal lines on a substrate and cutting certain sections of the signal lines. It is understood, that the required delay and therefore the length of the delay line depends on the frequencies of the overlap frequency band. The delay line is just an example, and other delay elements are also possible. The phase shifters may e.g. be adjusted or configured during production of the amplifier circuit, e.g. during an end of line test or a calibration step.

It is understood, that the phase shift is only required in the overlap frequency band, where signals from different signal paths overlap and mix.

As with the amplitude adjusting element, it is understood, that the configuration of the phase shifters may be determined only once and then be fixed for the life of the amplifier circuit. It is however also understood, that a control may be implemented for the phase shifter element that accounts for wear and aging effects in the signal paths and the diplexer.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
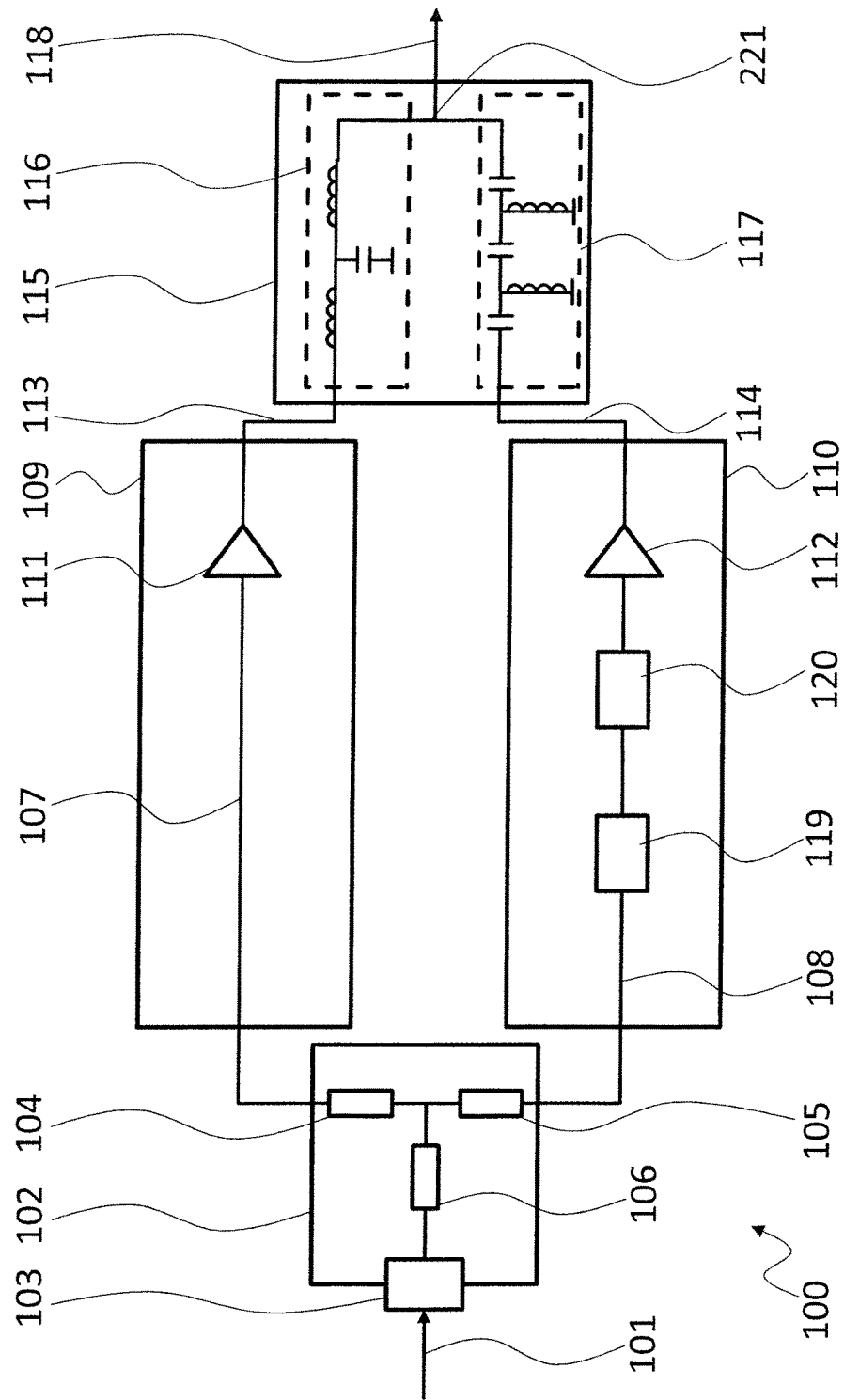
FIG. 1 shows a block diagram of an embodiment of an amplifier circuit according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a block diagram of an amplifier circuit 100. The amplifier circuit 100 comprises a signal splitter 102 with an input port 103 for receiving the incoming signal 101. The signal splitter 102 is coupled to two signal paths 109, 110. The two signal paths 109, 110 are coupled to a diplexer 115 that outputs a combined amplified signal 118.

The signal splitter 102 comprises a second resistor 106 coupled on one port to the input port 103. A first resistor 104 is coupled between the other port of the second resistor 106 and the input of the signal path 109. Another first resistor 105 is coupled between the other port of the second resistor 106 and the input of the signal path 110. The second resistor 106 may be optional and may in some embodiments be omitted. Further, the first resistors 104, 105 may e.g. be equal valued resistors to provide equal split signals 107, 108 to the two signal paths 109, 110. However, as will be explained below, the first resistors 104, 105 may also comprise different resistance values.

In the signal path 109 the split signal 107 is provided to an amplifier 111 that amplifies the split signal 107 and provides an amplified signal 113. In the signal path 110 the split signal 108 is also provided to an amplifier 112 that provides an amplified signal 114. However, in the signal path 110 an optional amplitude adjusting element 119 and an optional phase shifter 120 are provided in the signal line before the amplifier 112.

In the diplexer 115 two first frequency selective elements 116, 117 are provided. The upper first frequency selective element 116 comprises an exemplary arrangement of two series inductances and a capacitor connected between the junction or connection point of the two inductances and ground, for sake of clarity not referenced separately. The input of the upper first frequency selective element 116 is connected to the output of the amplifier 111 and receives the amplified signal 113. The output of the upper first frequency selective element 116 is connected to the summing point 121.

The lower first frequency selective element 117 comprises three series capacitors with an inductor coupled between the first junction or connection point of the first and the second capacitor and ground, and an inductor coupled between the second junction or connection point of the second capacitor and the third capacitor and ground. The input of the lower first frequency selective element 117 is coupled to the amplifier 112 and receives the amplified signal 114. The output of the lower first frequency selective element 117 is coupled to the summing point 121.

During operation of the amplifier circuit 100, the signal splitter 102 receives the incoming signal 101 via the input port 103. The signal splitter 102, i.e. the first resistors 104, 105 with the second resistor 106, split the incoming signal 101 into the split signals 107, 108.

In the signal path 109 the split signal 107 is amplified by amplifier 111. In the signal path 110, the split signal 108 is amplified by amplifier 112. However, in the signal path 110 the amplitude of the split signal 108 may be adapted by the amplitude adjusting element 119. Further, the phase of the split signal 108 may be adapted by the phase shifter 120. It is understood, that the amplitude adjusting element 119 and the phase shifter 120 may be omitted, of the output amplitude and output phase of the amplifier 112 match those of amplifier 111. Further, it is understood, that the amplitude adjusting element 119 and the phase shifter 120 may also be provided after amplifier 112. The amplitude adjusting element 119 may also be integrated into the first resistor 105. In this case first resistors 104, 105 may have different values.

The amplified signals 113, 114 are then provided to the diplexer 115, i.e. the upper first frequency selective element 116 and the lower first frequency selective element 117.

It can be seen, that the upper first frequency selective element 116 is a low pass filter, and that the lower first frequency selective element 117 is a high pass filter. The upper first frequency selective element 116 and the lower first frequency selective element 117 are adapted according to the frequency band that is amplified by respective amplifiers 111, 112. This means, that the passband of or frequency range that is passed through by the respective filters is at least as large as the frequency band of the respective signal path 109, 110. Further, in the center, where the frequency bands overlap, the passbands of the upper first frequency selective element 116 and the lower first frequency selective element 117 overlap.

Therefore, in the summing point 121, both signals, the amplified signal 113 and the amplified signal 114, will be present.

The amplitude adjusting element 119 and the phase shifter 120 may be configured once such that the amplified signal 114 matches the amplified signal 113 in amplitude and phase at least in the overlap frequency band. This configuration may e.g. be performed during production of the amplifier circuit 100.

Figure 2:
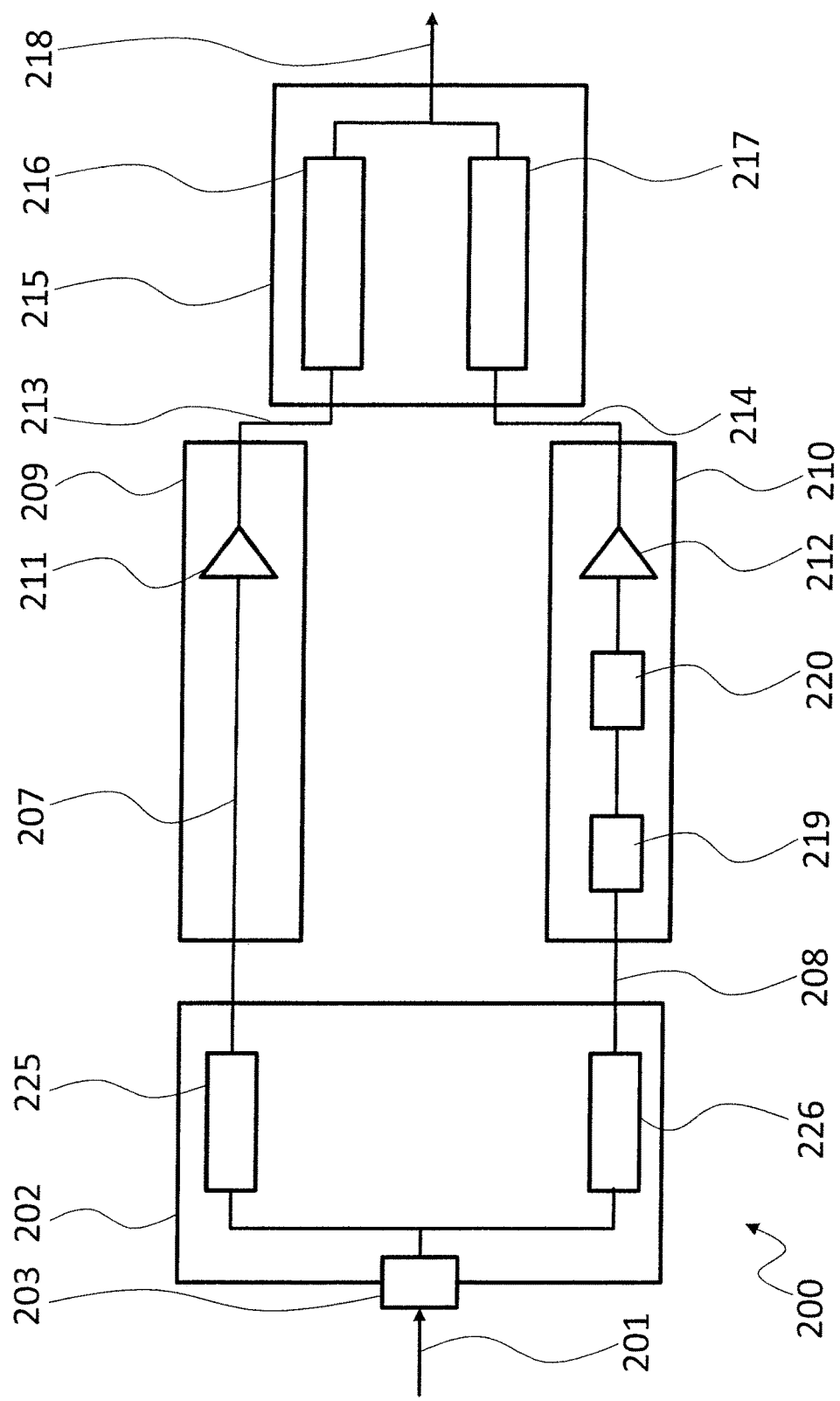
FIG. 2 shows a block diagram of another embodiment of an amplifier circuit according to the present invention.

FIG. 2 shows a block diagram of an amplifier circuit 200. The amplifier circuit 200 is based on the amplifier circuit 100. The amplifier circuit 200 therefore also comprises a signal splitter 202 with an input port 203 for receiving the incoming signal 201. The signal splitter 202 is coupled to a signal path 209 and a signal path 210. Both the signal paths, 209, 210 are coupled to a diplexer 215.

In contrast to the amplifier circuit 100, in the amplifier circuit 200 the signal splitter 202 comprises second frequency selective elements 225, 226 instead of the first and second resistors 104, 105, 106.

The second frequency selective elements 225, 226 may comprise high-pass and low-pass filters corresponding to the upper first frequency selective element 216 and the lower first frequency selective element 217.

It is understood, that the upper second frequency selective element 225 may comprise the same configuration as the upper first frequency selective element 216. The lower second frequency selective element 226 may comprise the same configuration as the lower first frequency selective element 217.

The same configuration in this context refers to the second frequency selective element 226 comprising the same frequency response. This means that the same topology with the same electronic elements and element values may be used as in the upper first frequency selective element 216. However, it is understood, that the current carrying capacities or power ratings of the elements may be reduced, since the signal power of the incoming signal 201 is lower than of the amplified signals 213, 214.

Although not shown, it is understood, that frequency selective elements, like e.g. a notch filter, may be inserted in the signal path 209 before or after amplifier 211.

Figure 3:
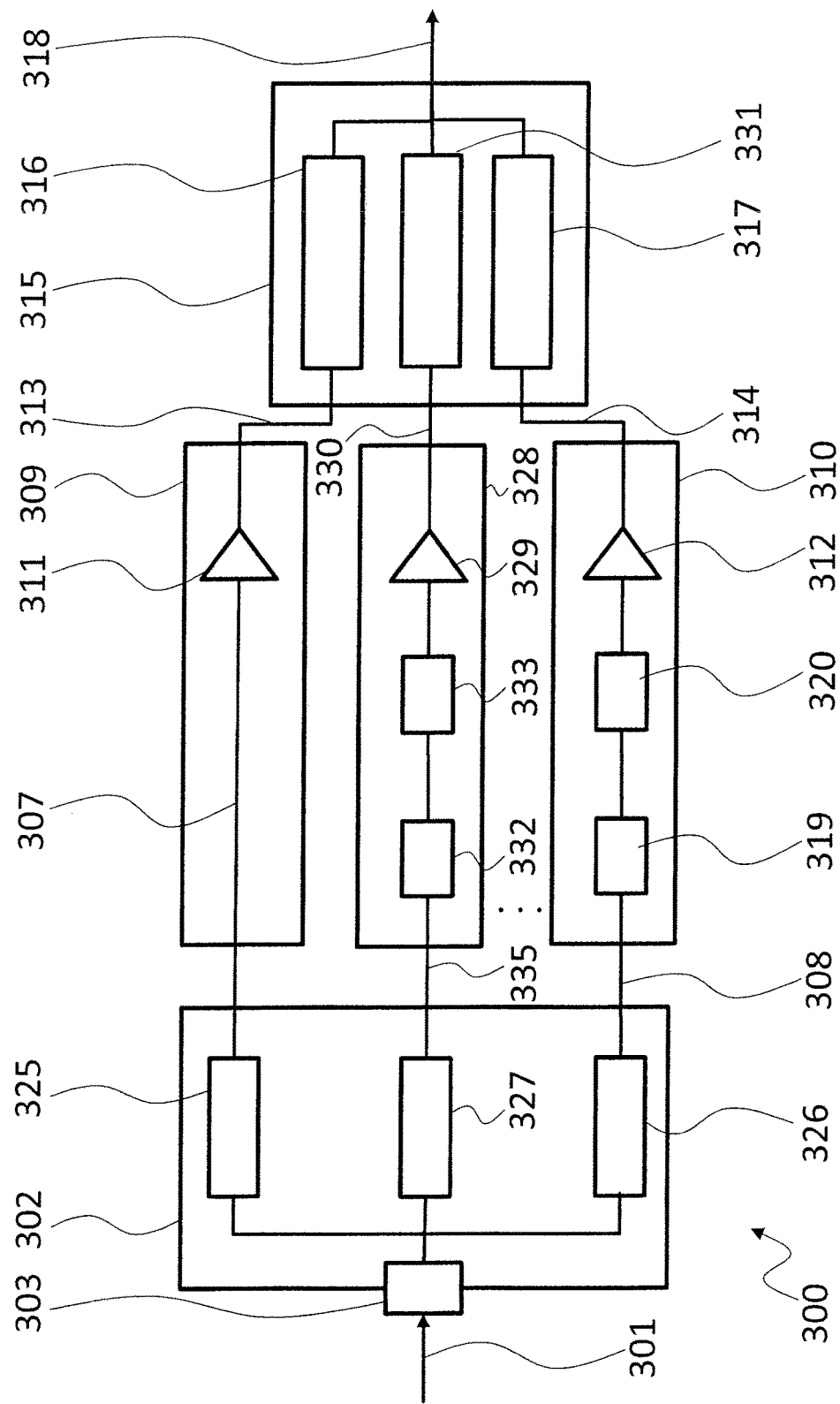
FIG. 3 shows a block diagram of another embodiment of an amplifier circuit according to the present invention.

FIG. 3 shows a block diagram of an amplifier circuit 300. The amplifier circuit 300 is based on the amplifier circuit 200. Therefore, the amplifier circuit 300 also comprises a signal splitter 302 with an input port 303 for receiving the incoming signal 301. The signal splitter 302 is coupled to a signal path 309 and a signal path 310. Both the signal paths 309, 310 are coupled to a diplexer 315.

In contrast to the amplifier circuit 200, the amplifier circuit 300 however comprises an additional signal path 328, and further possible signal paths are hinted at by three dots.

The signal path 328 is further accompanied by a further second frequency selective element 327 in the signal splitter 302, and a further first frequency selective element 331 in the diplexer 315.

The signal path 328 also comprises an amplitude adjusting element 332 and a phase shifter 3333 before an amplifier 329 that provides the amplified signal 330 to the first frequency selective element 331.

In the amplifier circuit 300 the frequency bands of the signal path 309 and the signal path 328 may overlap and the frequency bands off the signal path 328 and the signal path 310 may overlap.

It is understood, that if additional signal paths are provided, in any case the frequency bands of two of the signal paths will overlap. An intermediate signal path may therefore have a frequency band that overlaps on the lower end with the frequency band of another signal path, and that overlaps on the upper end with the frequency band of another signal path.

It is understood, that the amplitude adjusting element and the phase shifter are also optional or may be provided as required in the amplifier circuit 200 and the amplifier circuit 300, as well as for the amplifier circuit 100.

For sake of clarity in the following description of the method based FIG. 4 the reference signs used above in the description of apparatus based FIGS. 1-3 will be maintained. The same applies to the description of FIG. 5.

Figure 4:
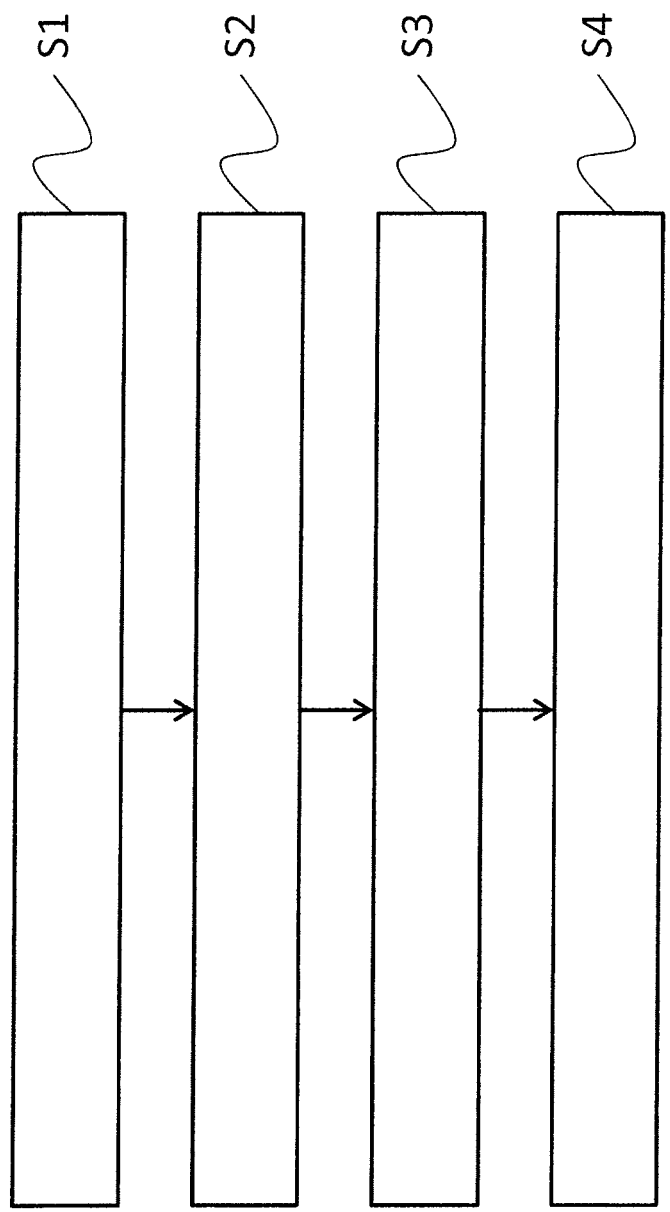
FIG. 4 shows a flow diagram of an embodiment of a method according to the present invention.

FIG. 4 shows a flow diagram of a method for amplifying an incoming signal 101, 201, 301.

The method comprises receiving S1 the incoming signal 101, 201, 301, splitting S2 the incoming signal 101, 201, 301 into split signals 107, 108, 207, 208, 307, 308, 335 for at least two signal paths 109, 110, 209, 210, 309, 310, 328, amplifying S3 the split signals 107, 108, 207, 208, 307, 308, 335 in the signal paths 109, 110, 209, 210, 309, 310, 328 with different overlapping frequency bands 550, 551, 552, and diplexing S4 the amplified signals 113, 114, 213, 214, 313, 314, 330 and providing a combined amplified signal 118, 218, 318.

The method may further comprise in the signal paths 109, 110, 209, 210, 309, 310, 328 amplifying the respective split signal 107, 108, 207, 208, 307, 308, 335 in the frequency band 550, 551, 552 of the respective signal path 109, 110, 209, 210, 309, 310, 328, i.e. separately in the signal paths 109, 110, 209, 210, 309, 310, 328.

Diplexing S4 may comprise for every signal path 109, 110, 209, 210, 309, 310, 328 passing through signals of the frequency band 550, 551, 552 of the respective signal path 109, 110, 209, 210, 309, 310, 328 to a summing point 121.

Diplexing S4 may e.g. be performed with a non-isolating diplexer 115, 215, 315. When passing through signals of the frequency band 550, 551, 552 of the respective signal path 109, 110, 209, 210, 309, 310, 328 overlapping frequency ranges may be used with the corner frequencies laying in the transmission band of the respective neighboring frequency band 550, 551, 552.

The method may further comprise adjusting the amplitude of the split signals 107, 108, 207, 208, 307, 308, 335 for a number of the signal paths 109, 110, 209, 210, 309, 310, 328 by a predetermined factor. The amplitude of the split signal 107, 108, 207, 208, 307, 308, 335 for at least one of the signal paths 109, 110, 209, 210, 309, 310, 328, e.g. a selected reference signal path 109, 110, 209, 210, 309, 310, 328 need not necessarily be adjusted.

Adjusting may be performed with an attenuation resistor or an amplifier 111, 112, 211, 212, 311, 312, 329. Splitting S2 ay be performed with a resistive splitter with a first resistor 104, 105 for every signal path 109, 110, 209, 210, 309, 310, 328. The signal splitter 102, 202, 302 may further comprise a second resistor 106 coupled between its input and the first resistors 104, 105.

Adjusting the amplitude of at least one of the signal paths 109, 110, 209, 210, 309, 310, 328 may then be performed with the first resistor 104, 105 of the signal splitter 102, 202, 302 for the respective signal path 109, 110, 209, 210, 309, 310, 328.

Splitting S2 may alternatively be performed with a second frequency selective element 225, 226, 325, 326, 327 for every signal path 109, 110, 209, 210, 309, 310, 328. The second frequency selective elements 225, 226, 325, 326, 327 may pass through signals of the frequency band 550, 551, 552 of the respective signal path 109, 110, 209, 210, 309, 310, 328 to the respective signal path 109, 110, 209, 210, 309, 310, 328.

The method may further comprise for a number of the signal paths 109, 110, 209, 210, 309, 310, 328 adjusting the phase of the split signal 107, 108, 207, 208, 307, 308, 335 for the respective signal path 109, 110, 209, 210, 309, 310, 328 by a predetermined factor. Wherein the phase of the split signal 107, 108, 207, 208, 307, 308, 335 for at least one of the signal paths 109, 110, 209, 210, 309, 310, 328 not necessarily needs to be adjusted.

Figure 5:
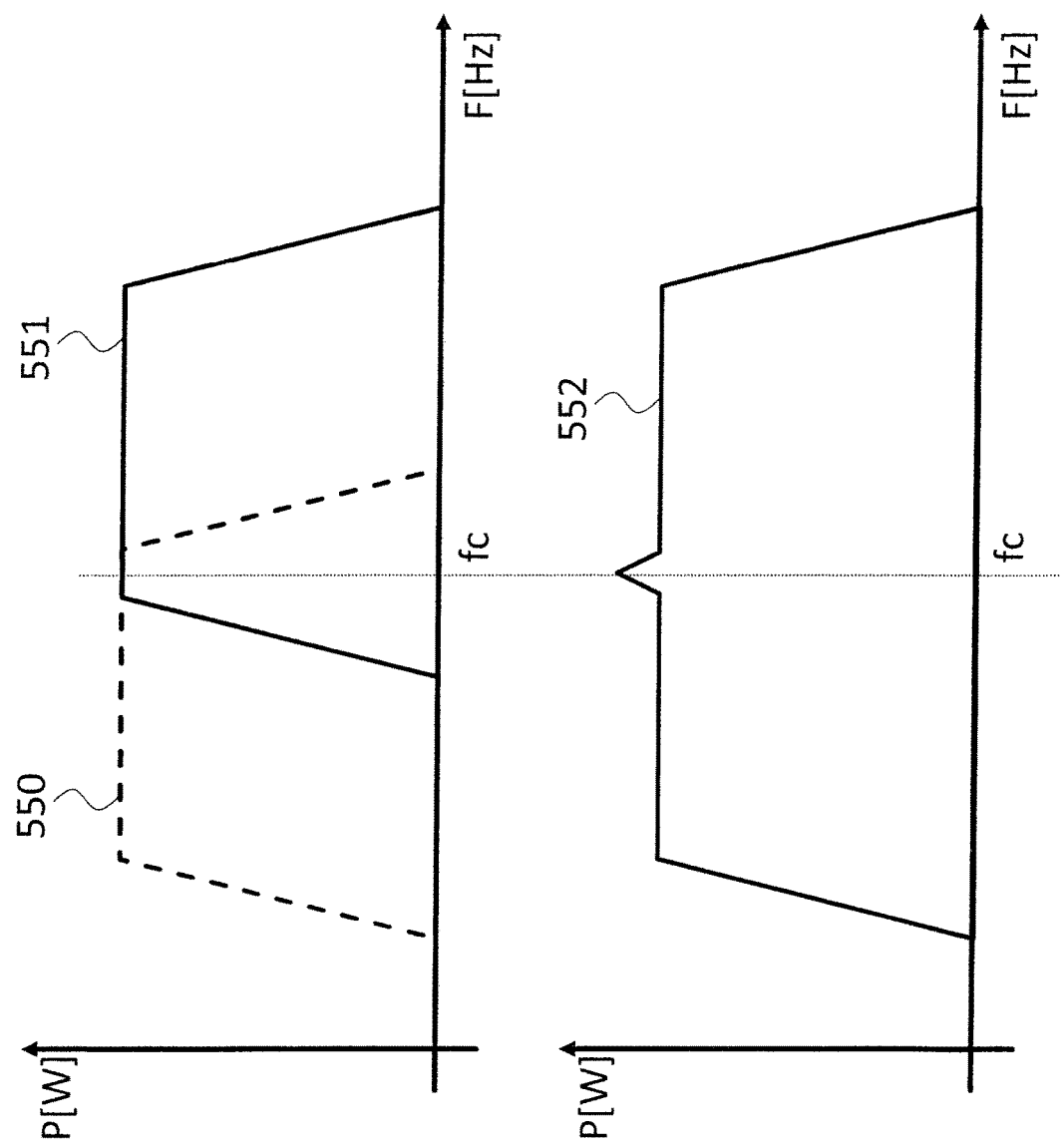
FIG. 5 shows a diagram with a possible frequency-response curve of an embodiment of an amplifier circuit according to the present invention.

FIG. 5 shows a diagram with a possible frequency-response curve of an amplifier circuit 100, 200. It is understood, that the possible frequency-response curve of an amplifier circuit 300 would comprise more than two frequency bands, however, the basic principles explained below would also apply.

The diagram of FIG. 5 is divided in an upper part and a lower part. The upper part shows the output power of an amplifier circuit 100, 200 with two signal paths 109, 110, 209, 210 over frequency. The lower part shows the combined output frequency band of the amplifier circuit 100, 200.

In the upper part of the diagram two frequency bands 550, 551 are shown. These two frequency bands 550, 551 represent the two overlapping frequency bands 550, 551 of two signal paths 109, 110, 209, 210.

It can be seen, that the falling edges of the frequency bands 550, 551 lay within the passband region of the respective other one of the frequency bands 550, 551, as already explained above.

In the lower part of the diagram, the combined or output frequency band 552 is shown. It can be seen, that the output frequency band 552 comprises the lower part (regarding frequency) of the frequency band 550 and the upper part (regarding frequency) of the frequency band 551. In the overlap region a small signal overshoot is present.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300 amplifier circuit
101, 201, 301 incoming signal
102, 202, 302 signal splitter
103, 203, 303 input port
104, 105 first resistor
106 second resistor 107, 108, 207, 208 split signal
307, 308, 335 split signal
109, 110, 209, 210 signal path
309, 310, 328 signal path
111, 112, 211, 212 amplifier
311, 312, 329 amplifier
113, 114, 213, 214 amplified signal
313, 314, 330 amplified signal
115, 215, 315 diplexer
116, 117, 216, 217 first frequency selective element
316, 317, 331 first frequency selective element
118, 218, 318 combined amplified signal
119, 219, 319, 332 amplitude adjusting element
120, 220, 320, 333 phase shifter
121 summing point
225, 226, 325, 326, 327 second frequency selective element
550, 551, 552 frequency band
S1-S4 method steps

What we claim is:

1. An amplifier circuit for amplifying an incoming signal, the amplifier circuit comprising:
at least two signal paths configured to amplify signals of different overlapping frequency bands,
a signal splitter comprising an input port configured to receive the incoming signal, the signal splitter being coupled to an input side of the signal paths and configured to split the incoming signal into split signals for the signal paths,
a diplexer coupled to an output side of the signal paths and configured to combine the amplified signals and provide a combined amplified signal, and
an amplitude adjusting element for a number of the signal paths, wherein the amplitude adjusting elements are configured to adjust the amplitude of the split signal for the respective signal path by a predetermined factor,
wherein at least one signal path comprises no amplitude adjusting element, and
wherein at least one of the amplitude adjusting elements comprises an attenuation resistor or an amplifier.

2. The amplifier circuit of claim 1, wherein every signal path comprises an amplifier configured to amplify the respective split signal in the frequency band of the respective signal path.

3. The amplifier circuit of claim 1, wherein the diplexer comprises a first frequency selective element for every signal path, wherein the first frequency selective elements are configured to pass through signals of the frequency band of the respective signal path to a summing point of the diplexer, and wherein the first frequency selective elements comprise overlapping frequency ranges with the corner frequencies of the first frequency selective elements laying in the transmission band of the first frequency selective element for the respective neighboring frequency band.

4. The amplifier circuit of claim 1, wherein the signal splitter comprises a resistive splitter with a first resistor for every signal path coupled between the signal input and the respective signal path.

5. The amplifier circuit of claim 4, wherein the signal splitter comprises a second resistor coupled between the input port and the first resistors.

6. The amplifier circuit of claim 4, wherein the attenuation resistor of at least one of the amplitude adjusting elements comprises the first resistor of the signal splitter for the respective signal path.

7. The amplifier circuit of claim 1, wherein the signal splitter comprises a frequency selective element for every signal path, wherein the second frequency selective elements are configured to pass through signals of the frequency band of the respective signal path to the respective signal path.

8. The amplifier circuit of claim 1, further comprising a phase shifter for a number of the signal paths, wherein the phase shifters are configured to adjust the phase of the split signal for the respective signal path by a predetermined phase shift.

9. The amplifier circuit of claim 8, wherein one signal path comprises no phase shifter.

10. A method for amplifying an incoming signal, the method comprising:
receiving the incoming signal,
splitting the incoming signal into split signals for at least two signal paths,
amplifying the split signals in the signal paths with different overlapping frequency bands, and
diplexing the amplified signals and providing a combined amplified signal,
wherein the amplitude of the split signal for at least one of the signal paths is not adjusted or wherein adjusting is performed with an attenuation resistor on an amplifier.

11. The method of claim 10, further comprising in the signal paths amplifying the respective split signal in the frequency band of the respective signal path.

12. The method of claim 10, wherein diplexing comprises for every signal path passing through signals of the frequency band of the respective signal path to a summing point, wherein diplexing is in particular performed with a non-isolating diplexer, and wherein when passing through signals of the frequency band of the respective signal path overlapping frequency ranges are used with the corner frequencies laying in the transmission band of the respective neighboring frequency band.

13. The method of claim 10, wherein splitting is performed with a signal splitter with a first resistor for every signal path.

14. The method of claim 13, wherein the signal splitter comprises a second resistor coupled between its input and the first resistors.

15. The method of claim 13, wherein adjusting the amplitude of at least one of the signal paths is performed with the first resistor of the signal splitter for the respective signal path.

16. The method of claim 10, wherein splitting is performed with a frequency selective element for every signal path, wherein the frequency selective elements pass through signals of the frequency band of the respective signal path to the respective signal.

17. The method of claim 10, further comprising for a number of the signal paths adjusting the phase of the split signal for the respective signal path by a predetermined phase shift, wherein the phase of the split signal for at least one of the signal paths is not adjusted.

* * * * *